United States Patent
Halbert et al.

(10) Patent No.: US 6,747,887 B2
(45) Date of Patent: *Jun. 8, 2004

(54) MEMORY MODULE HAVING BUFFER FOR ISOLATING STACKED MEMORY DEVICES

(75) Inventors: John B. Halbert, Beaverton, OR (US); Randy M. Bonella, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/263,995

(22) Filed: Oct. 2, 2002

(65) Prior Publication Data

US 2003/0035312 A1 Feb. 20, 2003

Related U.S. Application Data

(63) Continuation of application No. 09/666,528, filed on Sep. 18, 2000, now Pat. No. 6,487,102.

(51) Int. Cl.[7] .................................................. G11C 5/02
(52) U.S. Cl. ............................... 365/51; 365/52; 365/63
(58) Field of Search ................................. 365/51, 52, 63

(56) References Cited

U.S. PATENT DOCUMENTS

| 3,787,673 A | * | 1/1974 | Watson et al. ............... 708/521 |
| 4,982,265 A | | 1/1991 | Watanabe et al. |
| 5,517,057 A | | 5/1996 | Beilstein, Jr. et al. |
| 5,532,954 A | | 7/1996 | Bechtolsheim et al. |
| 5,581,498 A | | 12/1996 | Ludwig et al. |
| 5,790,447 A | * | 8/1998 | Laudon et al. ................. 365/52 |
| 5,943,254 A | | 8/1999 | Bakeman, Jr. et al. |
| 5,953,215 A | | 9/1999 | Karabatsos |
| 5,963,716 A | | 10/1999 | Welborn et al. |
| 6,211,883 B1 | * | 4/2001 | Goel ........................... 345/423 |

FOREIGN PATENT DOCUMENTS

| EP | 0 744 748 A2 | 11/1996 |
| WO | PCT/US98/25181 | 11/1998 |

* cited by examiner

*Primary Examiner*—Huan Hoang
(74) *Attorney, Agent, or Firm*—Marger Johnson & McCollom P.C.

(57) ABSTRACT

The present invention utilizes a buffer to isolate a stack of memory devices, thereby taking advantage of the increased memory density available from stacked memory devices while reducing capacitive loading. A memory module in accordance with the present invention may include a stack of memory devices and a buffer coupled to the first and second memory devices and arranged to capacitively isolate the first and second memory devices from a bus. In a memory system in accordance with the present invention, multiple buffered stacks of memory devices are preferably coupled in a point-to-point arrangement, thereby further reducing capacitive loading.

5 Claims, 2 Drawing Sheets

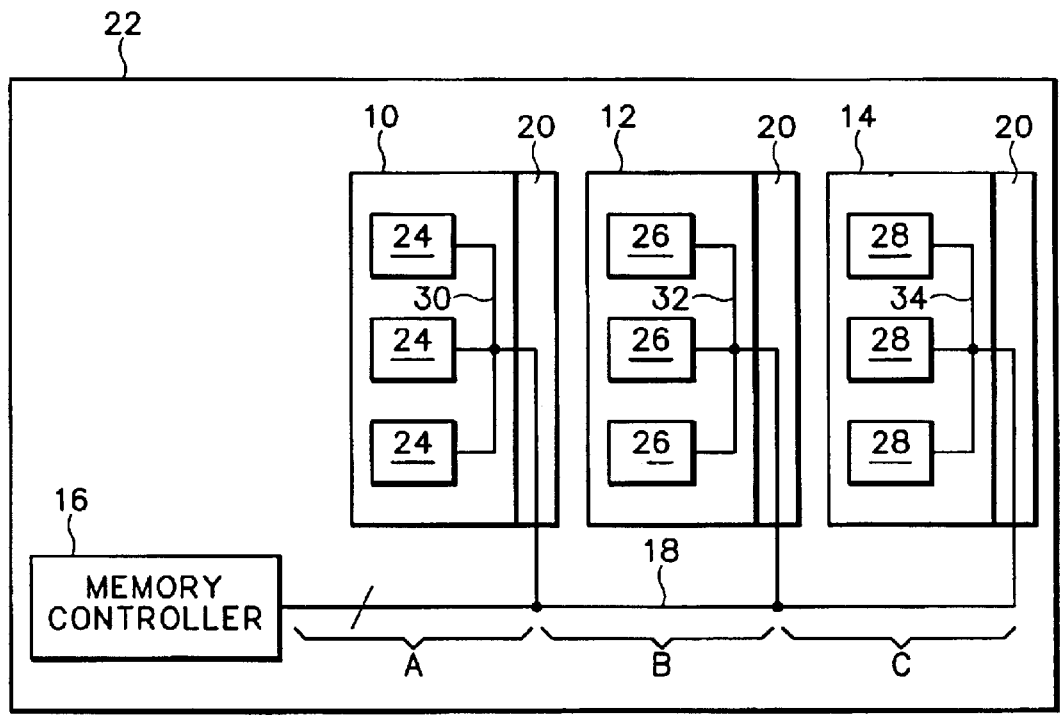
FIG.1
(PRIOR ART)
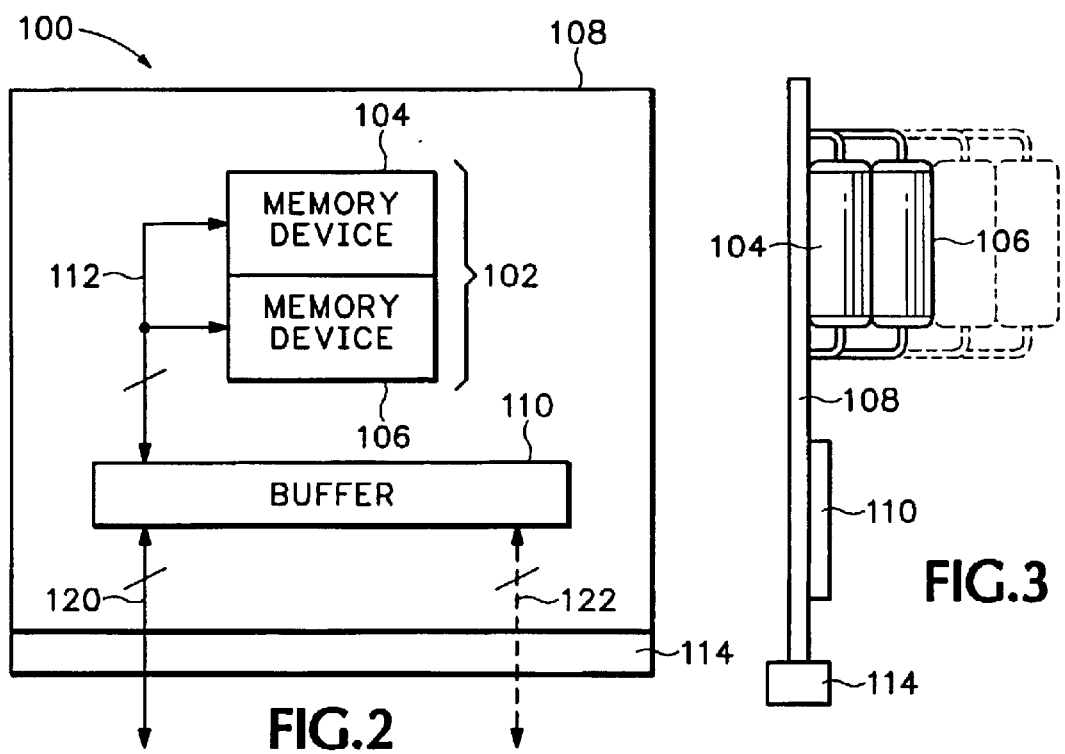
FIG.2
FIG.3

MEMORY MODULE HAVING BUFFER FOR ISOLATING STACKED MEMORY DEVICES

This application is a continuation of prior U.S. patent application Ser. No. 09/666,528 filed Sep. 18, 2000 now U.S. Pat. No. 6,487,102.

BACKGROUND OF THE INVENTION

FIG. 1 is a block diagram of a prior art memory system. The system of FIG. 1 includes three memory modules 10, 12, and 14 that are coupled to a memory controller 16 through a bus 18. Each memory module is fabricated on a circuit board that plugs into a connector 20 on a mother board 22. Each module includes multiple memory devices 24, 26, and 28 that are coupled to the bus 18 to allow the memory controller to access the memory devices.

To increase the memory density of the modules, memory devices can be stacked on top of each other, thereby increasing the memory capacity of each module without increasing the space required on the circuit board. Stacking memory devices, however, increases the capacitive loading of the signals on the bus. For example, from the perspective of the memory controller 16, each data line in the bus 18 has a total capacitance that equals the sum of the capacitance of each portion of the signal line running through sections A, B, and C of the bus, plus the capacitance of the portion of the data line in sections 30, 32, and 34 that couple the memory devices to the bus, plus the sum of the input capacitance of all of the memory devices (which are attached to sections 30, 32, and 34 in parallel). If additional memory devices are stacked on devices 24, 26, and 28, then the capacitance of the additional devices are added to the total capacitance seen by the controller. Therefore, when the memory controller drives a data signal onto the bus, it must overcome the combined capacitance of all of the stacked memory devices. This heavy capacitive loading reduces the maximum operating speed and increases the power consumption by the memory system, especially at higher operating frequencies.

BRIEF DESCRIPTION OF THE DRAWINGS

FIG. 1 is a block diagram of a prior art memory system.

FIG. 2 is a block diagram of an embodiment of a memory module in accordance with the present invention.

FIG. 3 is a side view showing the mechanical arrangement of an embodiment of a memory module in accordance with the present invention.

DETAILED DESCRIPTION

Figure 4:
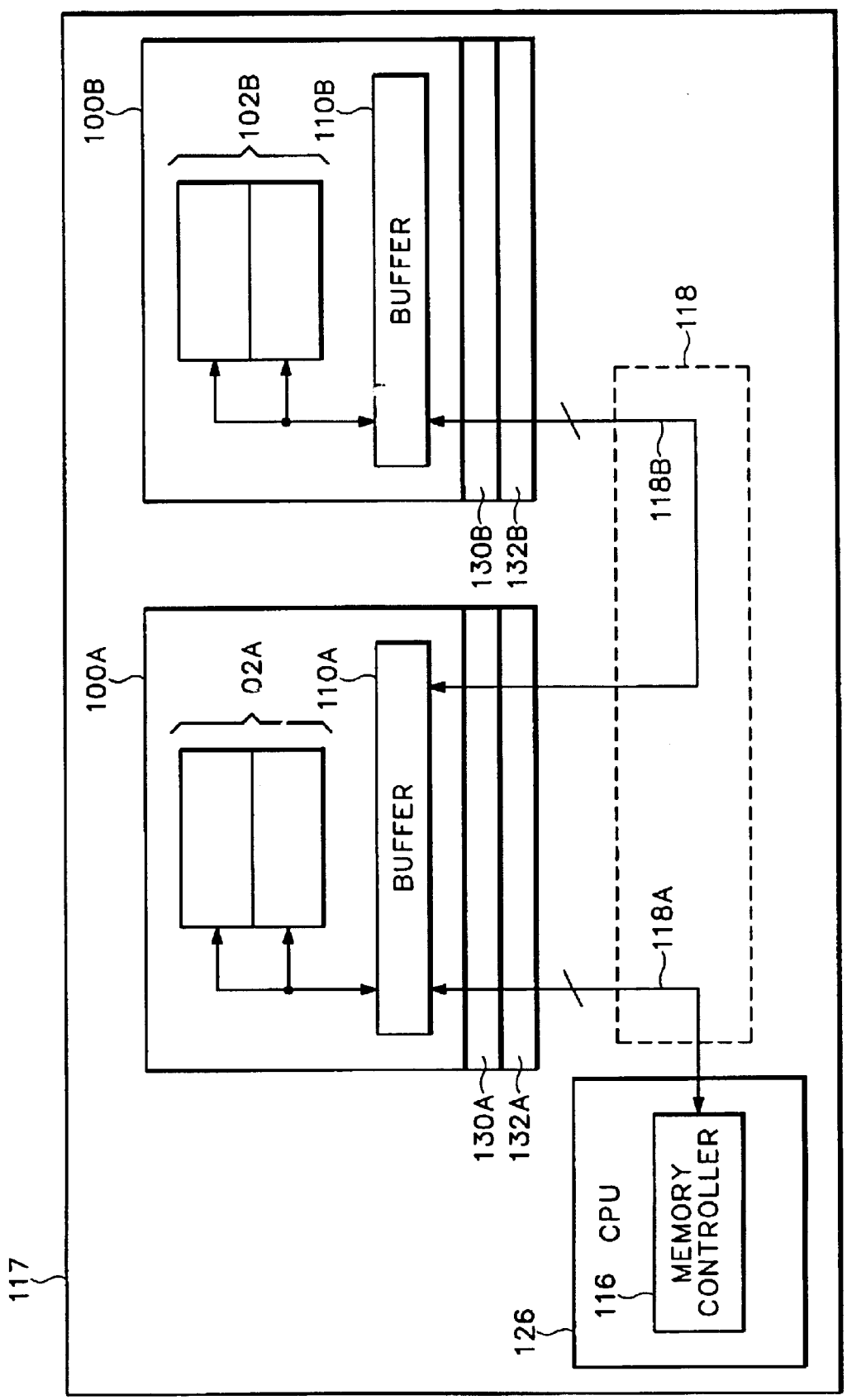
FIG. 4 is a block diagram of an embodiment of a memory system in accordance with the present invention.

FIG. 2 is a block diagram of an embodiment of a memory module 100 in accordance with the present invention. Module 100 includes a first memory device 104, which is mounted on a circuit board 108. A second memory device 106 is stacked on top of the first memory device to form a stack 102. A buffer 110 is mounted on the circuit board and electrically coupled to the memory devices 104 and 106 through signal lines 112. A connector 114 is attached to the circuit board for coupling the memory module to a bus that leads to a memory controller on another circuit board, e.g., a computer mother board. The buffer 110 is arranged to capacitively isolate the stack of memory devices from the bus. Therefore, the capacitive loading seen by a memory controller (or other device) driving the bus is reduced. This increases the maximum operating speed of the memory module and reduces power consumption.

The buffer 110 sends and receives signals to and from the memory controller through connector 114 over signal lines 120. In a preferred embodiment, the buffer 110 is designed to receive signals from the memory controller over a first bus and redrive them back out the connector over signal lines 122 (shown in broken lines) and to a second memory module over a second bus.

FIG. 3 is a side view showing the mechanical arrangement of an embodiment of a memory module in accordance with the present invention. The stack 102 can be extended to include additional memory devices (shown in broken lines). Additional stacks can also be added, and they can be buffered by the first buffer 110, or a separate buffer can be used for each stack.

FIG. 4 is a block diagram of an embodiment of a memory system in accordance with the present invention. The system of FIG. 4 includes two modules 100A and 100B coupled to a memory controller 116 on a computer mother board 117 through a bus system 118, which includes buses 118A and 118B. The modules may be coupled through connectors 130A and 130B, which plug into connectors 132A and 132B, respectively, on the mother board. Each module a stack of memory devices 102A, 102B and a buffer 110A, 110B that isolates the corresponding stack from the bus system. In the example of FIG. 4, the modules are coupled to the memory controller in a point-to-point arrangement. That is, the memory controller 116 is coupled to module 100A, which is designed to receive signals from the memory controller and redrive them to module 100B. The use of point-to-point wiring further reduces the capacitive loading seen by the memory controller. Alternatively, the modules 110A and 110B and memory controller 116 may be coupled together in a multi-drop arrangement in which both of the modules are essentially coupled in parallel on a single bus.

The memory controller 116 is shown in FIG. 4 as part of a central processing unit (CPU) 126, however, it may alternatively be implemented as one chip of a chipset, or in any other suitable form. The memory system shown in FIG. 4 includes two memory modules for purposes of illustration, but may be implemented with only a single memory module or with any number of modules. The buffers need not be mounted on the memory modules, but can also be mounted on the mother board or any other device on which the bus system resides. Moreover, the stacks of memory devices need not be mounted on modules. Instead, an entire memory system in accordance with the present invention may be fabricated on a single circuit board including the memory controller, bus, stacks of memory devices, and buffers arranged to capacitively isolate the stacks from the bus. The advantages of the present invention can be realized wherever memory devices are stacked by buffering the stack from other components, thereby reducing the capacitance load seen by the other component.

Having described and illustrated the principles of the invention in some preferred embodiments thereof, it should be apparent that the invention can be modified in arrangement and detail without departing from such principles. We claim all modifications and variations coming within the spirit and scope of the following claims.

What is claimed is:

1. A memory system comprising:

a first memory device;

a second memory device stacked on the first memory device; and a data buffer coupled to the first and second memory devices, wherein the data buffer is not stacked with the first and second memory devices, and the data buffer and memory devices are mounted in separate packages.

2. A memory system according to claim 1 further comprising a third memory device stacked on the second memory device and coupled to the data buffer.

3. A memory system according to claim 1 further comprising a data bus coupled to the data buffer.

4. A memory system according to claim 3 further comprising a memory controller coupled to the data bus.

5. A memory system comprising:

a data bus;

a stack of memory devices, and a data buffer coupled between the stack of memory devices and the data bus, wherein the stack of memory devices is not stacked on the data buffer, and the data buffer and memory devices are mounted in separate packages.

* * * * *

UNITED STATES PATENT AND TRADEMARK OFFICE
CERTIFICATE OF CORRECTION

PATENT NO. : 6,747,887 B2
DATED : June 8, 2004
INVENTOR(S) : Halbert et al.

It is certified that error appears in the above-identified patent and that said Letters Patent is hereby corrected as shown below:

<u>Column 4,</u>
Line 3, "memory devices, and" should read -- memory devices; and --.

Signed and Sealed this

Eighteenth Day of January, 2005

JON W. DUDAS
*Director of the United States Patent and Trademark Office*